(12) United States Patent
Patel

(10) Patent No.: US 12,388,007 B2
(45) Date of Patent: Aug. 12, 2025

(54) CAPACITOR NETWORKS FOR HARMONIC CONTROL IN POWER DEVICES

(71) Applicant: MACOM Technology Solutions Holdings, Inc., Lowell, MA (US)

(72) Inventor: Prity Kirit Patel, Cary, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 18/582,162

(22) Filed: Feb. 20, 2024

(65) Prior Publication Data

US 2024/0194584 A1    Jun. 13, 2024

Related U.S. Application Data

(63) Continuation of application No. 17/113,666, filed on Dec. 7, 2020, now Pat. No. 11,929,317.

(51) Int. Cl.
*H01L 23/522* (2006.01)
*H10D 1/68* (2025.01)
*H10D 84/80* (2025.01)

(52) U.S. Cl.
CPC .......... *H01L 23/5223* (2013.01); *H10D 1/68* (2025.01); *H10D 84/811* (2025.01)

(58) Field of Classification Search
CPC . H01L 23/481; H01L 23/5223; H01L 23/642; H01L 23/66; H01L 2223/6611;

(Continued)

(56) References Cited

U.S. PATENT DOCUMENTS

| | | |
|---|---|---|
| 5,194,932 A | 3/1993 | Kurisu |
| 5,233,313 A | 8/1993 | Kohno et al. |

(Continued)

FOREIGN PATENT DOCUMENTS

| | | |
|---|---|---|
| CN | 114597198 A | 6/2022 |
| EP | 3561869 A1 | 10/2019 |

(Continued)

OTHER PUBLICATIONS

Extended European Search Report for European Application No. 21210343.6 dated May 3, 2022.

*Primary Examiner* — Nelson Garces
(74) *Attorney, Agent, or Firm* — Perilla Knox Hildebrandt LLP; Jason M. Perilla

(57) ABSTRACT

New types, structures, and arrangements of capacitor networks for harmonic control and other purposes are described. An example capacitor network includes a bond pad and metal-insulator-metal (MIM) capacitors positioned over the top side of the substrate and along different sides of the bond pad. A first metal layer of each of the plurality of MIM capacitors is electrically coupled to the bond pad. A second metal layer of each of the plurality of MIM capacitors is electrically coupled to a ground plane on a bottom side of the substrate by a through-substrate via. The MIM capacitors can be arranged around the bond pad in the capacitor network for a tailored capacitance. A matching network in the integrated device can incorporate the capacitor network to reduce loss, provide better harmonic termination, and achieve better phase alignment for the power devices.

20 Claims, 7 Drawing Sheets

(58) Field of Classification Search
CPC ... H01L 2223/6655; H01L 2224/32245; H01L 2224/48137; H01L 2224/48195; H01L 2224/48247; H01L 2224/49111; H01L 2224/49175; H01L 24/48; H01L 25/16; H01L 27/0629; H01L 28/40; H10D 1/60; H10D 1/68

See application file for complete search history.

(56) References Cited

U.S. PATENT DOCUMENTS

| | | |
|---|---|---|
| 6,060,951 A | 5/2000 | Inoue |
| 6,256,189 B1 * | 7/2001 | Chroneos, Jr. .......... H01L 23/36 257/E23.101 |
| 6,992,346 B2 | 1/2006 | Kim et al. |
| 7,508,021 B2 | 3/2009 | Ren et al. |
| 8,610,188 B2 | 12/2013 | Kerber et al. |
| 8,804,366 B2 | 8/2014 | Kamgaing et al. |
| 8,866,260 B2 | 10/2014 | Shieh et al. |
| 9,214,903 B2 | 12/2015 | Miwa et al. |
| 9,231,046 B2 | 1/2016 | Daubenspeck et al. |
| 9,640,530 B2 | 5/2017 | Sasaki et al. |
| 10,714,420 B1 | 7/2020 | Rubin et al. |
| 10,742,178 B2 | 8/2020 | Zhu et al. |
| 11,929,317 B2 | 3/2024 | Patel |
| 2019/0165673 A1 | 5/2019 | Otsuka et al. |
| 2019/0326233 A1 | 10/2019 | Uscola et al. |
| 2019/0356284 A1 | 11/2019 | Zhu et al. |
| 2021/0126593 A1 | 4/2021 | Roberts et al. |
| 2021/0175860 A1 | 6/2021 | Roberts et al. |
| 2021/0242840 A1 * | 8/2021 | Shilimkar ............ H03F 1/0288 |
| 2022/0085772 A1 * | 3/2022 | Holmes .................. H03F 3/195 |

FOREIGN PATENT DOCUMENTS

| | | |
|---|---|---|
| EP | 4009366 A1 | 6/2022 |
| JP | H0243761 A | 2/1990 |
| JP | 2000151223 A | 5/2000 |
| JP | 2003008357 A | 1/2003 |
| JP | 2022090628 A | 6/2022 |
| KR | 20060062602 A | 6/2006 |
| KR | 101128726 B1 | 3/2012 |
| KR | 101405684 B1 | 6/2014 |
| TW | 202017194 A | 5/2020 |
| WO | 2013071152 A2 | 5/2013 |
| WO | 2019155601 A1 | 8/2019 |

* cited by examiner

US 12,388,007 B2

CAPACITOR NETWORKS FOR HARMONIC CONTROL IN POWER DEVICES

CROSS-REFERENCE TO RELATED APPLICATIONS

This application is a continuation of U.S. patent application Ser. No. 17/113,666, filed Dec. 7, 2020, entitled "CAPACITOR NETWORKS FOR HARMONIC CONTROL IN POWER DEVICES," the entire contents of which is hereby incorporated herein by reference.

BACKGROUND

High-speed power amplifiers formed from semiconductor materials have a variety of useful applications, such as radio-frequency (RF) communications, radar, RF energy, power conversion, and microwave applications. Supporting mobile communications under current and proposed communication standards, such as WiMax, 4G, and 5G, can place high performance demands on high-speed amplifiers constructed from semiconductor transistors. The amplifiers may need to meet performance specifications related to output power, signal linearity, signal gain, bandwidth, and efficiency, among others.

Efficient, high-speed, broadband, high-power amplifiers can be constructed from multiple transistors operating in parallel circuit paths and formed from semiconductor materials such as, but not limited to, gallium-nitride (GaN) materials. GaN materials have received appreciable attention in recent years because of the desirable electronic and electro-optical properties of the materials. Because of its wide bandgap, GaN materials are useful for high-speed, high-voltage, and high-power applications.

SUMMARY

Structures and arrangements of capacitor networks for harmonic control and other purposes are presented. An example capacitor network includes a bond pad and metal-insulator-metal (MIM) capacitors positioned over a top side of the substrate and along different sides of the bond pad. A first metal layer of each of the plurality of MIM capacitors is electrically coupled to the bond pad. A second metal layer of each of the plurality of MIM capacitors is electrically coupled to a ground plane on a bottom side of the substrate by a through-substrate via. The MIM capacitors can be arranged around the bond pad in the capacitor network for a tailored capacitance. The MIM capacitors are positioned along four different sides of the bond pad in one example. In other aspects, the first metal layer of each of the plurality of MIM capacitors is electrically coupled to the bond pad by a metal trace that extends across and over the top side of the substrate between the first metal layer of the MIM capacitor and the bond pad. In another case, the second metal layer of each of the plurality of MIM capacitors is electrically coupled to the through-substrate via by a metal trace that extends across and over the top side of the substrate between the second metal layer of the MIM capacitor and the through-substrate via. The capacitor network can also include a number of through-substrate vias positioned along a number of different sides of a MIM capacitor. In another aspects, each MIM capacitor is electrically coupled to the ground plane by a plurality of through-substrate vias.

An example integrated device includes a power transistor formed on a first substrate, a capacitor network formed on a second substrate, and at least one bond wire electrically coupled between the power transistor and the bond pad of the capacitor network. The capacitor network includes a bond pad over a top side of the second substrate, and MIM capacitors positioned over the top side of the second substrate and along a plurality of different sides of the bond pad. A first metal layer of each of the plurality of MIM capacitors is electrically coupled to the bond pad, and a second metal layer of each of the plurality of MIM capacitors is electrically coupled to a ground plane on a bottom side of the second substrate by a through-substrate via.

In other examples, the integrated device can also include a second capacitor network formed on a third substrate. The first substrate, the second substrate, and the third substrate can be arranged together in the single device package of the integrated device. The integrated device can include at least one bond wire electrically coupled between the power transistor and the capacitor network. The integrated device can also include at least one other bond wire electrically coupled between the power transistor and the second capacitor network.

Another example capacitor network includes a bond pad over a substrate, and MIM capacitors positioned over the substrate and along a plurality of different sides of the bond pad. A first metal layer of each of the plurality of MIM capacitors is electrically coupled to the bond pad, and a second metal layer of each of the plurality of MIM capacitors is electrically coupled to a ground plane.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Applications supporting mobile communications and wireless internet access, for example, can place high performance demands on high-speed RF amplifiers constructed from semiconductor transistors. The amplifiers may need to meet performance specifications related to output power, signal linearity, signal gain, bandwidth, and efficiency, among others. Multiple transistors can be used in various stages of an amplifier. The individual transistors in a single amplifier can vary in many characteristics as compared to each other, as the demands of each stage in the design may differ.

One approach to amplifying signals for communications is to use a Doherty amplifier, although a number of different amplifier topologies are known. A standard Doherty power amplifier utilizes two transistors, a main or carrier transistor and an auxiliary or peaking transistor. The main transistor is typically designed to operate linearly and efficiently over a wide range of input powers and dissipate a relatively large amount of power. The auxiliary transistor is designed to operate at relatively higher input powers and dissipate a relatively small amount of power.

Aspects of the embodiments described herein can be used for better second-harmonic termination using an input network at the input of a power transistor in a power amplifier, among other benefits. The embodiments can increase the peak drain efficiency and peak output power of transistors in power amplifiers and related integrated devices. Thus, new types, structures, and arrangements of capacitor networks for harmonic control in power amplifiers and other purposes are described.

In one example, an integrated device includes a capacitor network and one or more power devices. The capacitor network includes a bond pad and one or more metal-insulator-metal (MIM) capacitors. The capacitors include a first metal layer, a second metal layer, an insulator layer between the first and second metal layers, and one or more through-substrate vias. The first metal layer is coupled to the bond pad, and the second metal layer is coupled to a ground plane on a bottom side of the substrate by the vias. A number of capacitors can be arranged around the bond pad in the capacitor network for a tailored capacitance having a relatively high quality ("Q") factor. A matching network in the integrated device can incorporate the capacitor network to reduce loss, provide better harmonic termination, and achieve better phase alignment for the power devices.

Figure 1:
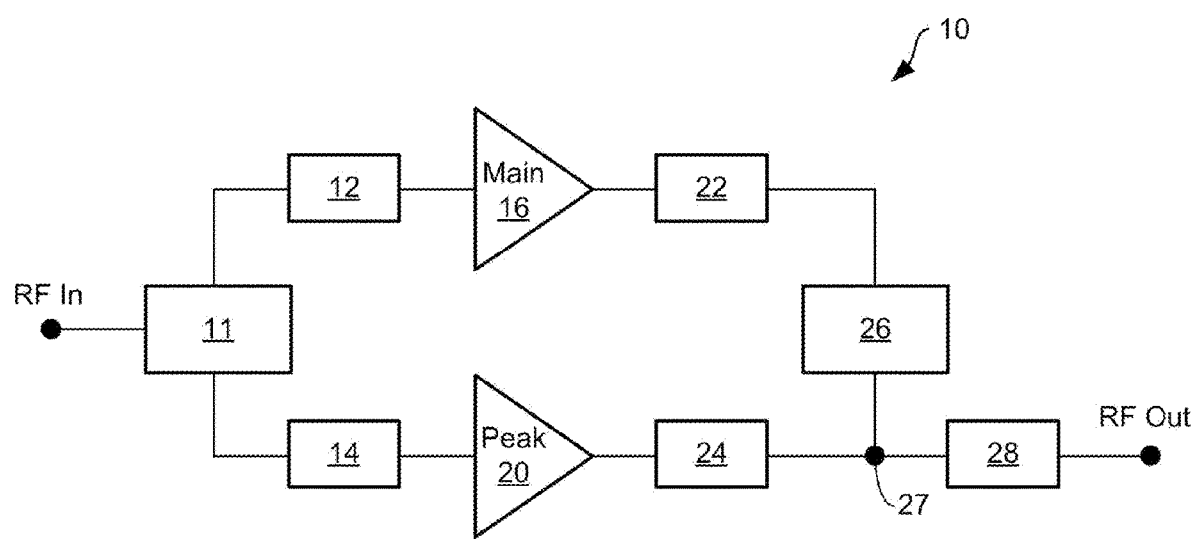
FIG. 1 illustrates an example amplifier according various embodiments described herein.

Turning to the drawings, FIG. 1 illustrates an example amplifier 10 according various embodiments described herein. The amplifier 10 comprises a Doherty amplifier, as described below. The amplifier 10 is provided as a representative example of one type of integrated circuit that may benefit from the use of the capacitor networks and harmonic control concepts described herein. Other types of amplifiers and other integrated circuits can rely upon and incorporate the concepts, and the concepts are not limited to use with any particular type of amplifier, integrated circuit, or integrated device package.

The amplifier 10 comprises a 90-degree power splitter 11, which divides a received RF input signal into two outputs that are coupled, respectively, to a main amplifier 16 and an auxiliary or peaking amplifier 20, arranged on parallel circuit branches. The power splitter 11 also delays (e.g., by approximately 90 degrees) the phase of the signal provided to the peaking amplifier 20 with respect to the phase of the signal provided to the main amplifier 13.

The amplifier 10 also includes impedance-matching components 12 and 14, which are coupled before the main amplifier 16 and peaking amplifier 20, respectively. The impedance-matching components match the output impedances of power splitter 11 to the input impedances of the main amplifier 16 and the peaking amplifier 20, to reduce signal reflections and other unwanted effects.

Additional impedance-matching components 22 and 24 are coupled at the outputs of the main amplifier 16 and the peaking amplifier 20, to match impedances among the main amplifier 16, the peaking amplifier 20, and the combining node 27. The impedance inverter 26 rotates the phase of the signal output from the main amplifier 16, so that the signals from the main amplifier 16 and the peaking amplifier 20 will be substantially in phase at the combining node 27. As shown in FIG. 1, an output impedance-matching component 28 can also be coupled between the combining node 27 and an output of the amplifier 10, to match the output impedance of the amplifier 10 to an impedance of a load (not shown).

By design, the peaking amplifier 20 is typically off at lower power levels, which can be handled by the main amplifier 16 alone. At higher power levels, the main amplifier 16 can become saturated, and the gain of the main amplifier 16 can be compressed, resulting in a loss of linearity for the amplifier 10. The compression point for the main amplifier 16 can vary depending upon its design. When the peaking amplifier 20 is on, it effectively adds load impedance to the main amplifier 16 (reducing the gain of the main amplifier 16) but also assists in extending the linearity of amplification to higher power levels.

There are a number of different concerns in the design of the amplifier 10. Among other design considerations, the amplifier 10 should be designed for low loss, phase alignment, and harmonic termination and control. The impedance-matching components 12 and 14 can be tailored to improve those operational aspects of the amplifier 10 according to the embodiments. The impedance-matching components 12 and 14 can include new types, structures, and arrangements of capacitors and capacitor networks. The improvements to the capacitors and capacitor networks described herein can be used for better second-harmonic termination using an input network at the input of a power transistor, among other benefits. The improvements can also be extended for better first-harmonic termination using designs with larger capacitances. The embodiments can also increase the peak drain efficiency and peak output power of transistors in power amplifiers and related integrated devices.

Figure 2:
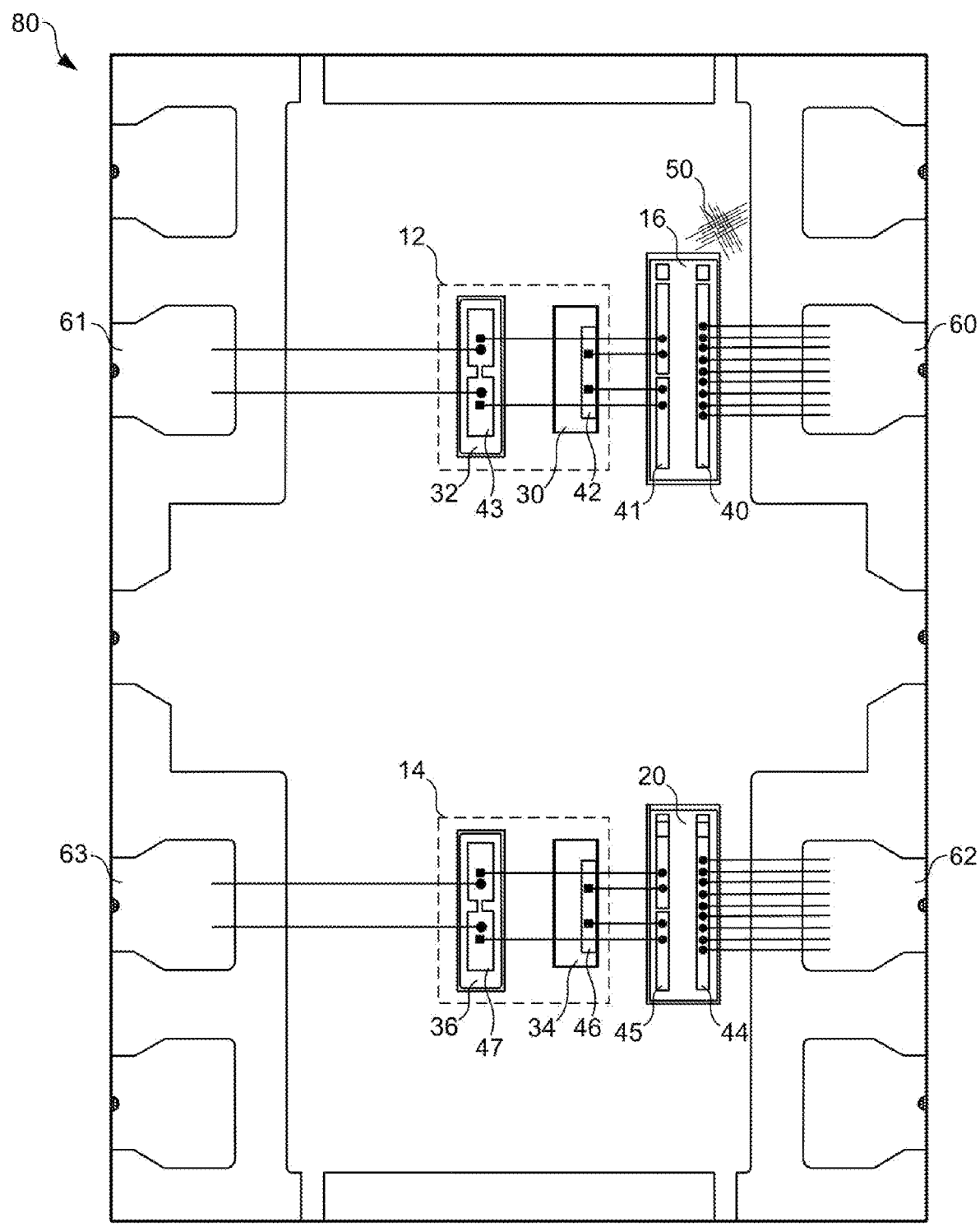
FIG. 2 illustrates an example package layout for components of an amplifier according various embodiments described herein.

FIG. 2 illustrates an example package layout 80 for components of an amplifier according various embodiments described herein. The layout 80 is for a dual-flat no-leads (DFN) package. The package is designed for physical and electrical connection to a larger circuit, such as a circuit implemented using a printed circuit board (PCB). However, the layout 80 can be extended for use in other packages, such as a quad-flat no-leads (QFN) package or other suitable packages, with or without leads. The concepts can also be implemented using other plastic over-mold packages or enclosures, ceramic air-cavity packages, and plastic air-cavity packages, but the concepts are not limited to use with any particular type of package.

The package layout 80 is provided as an example of an integrated device in which the capacitor networks described herein can be relied upon. A number of components of the amplifier 10 shown in FIG. 1 are provided for in the layout 80. However, not all of the components or circuit elements of the amplifier 10 are shown in FIG. 2. Some components of the amplifier 10 can be implemented external to the package layout 80 or are omitted from view in FIG. 2 for simplicity.

The package layout 80 is shown without any encapsulation. The package layout 80 includes a thermal pad 50 and a number of lead frame pads 60-63, among others. The impedance-matching components 12 and 14, the main amplifier 16, and the peaking amplifier 20 are mounted to and electrically connected with the thermal pad 50 in the example shown.

The main amplifier 16 can be embodied as a multi-finger planar field-effect transistor (FET) in one example, and the peaking amplifier 20 can also be embodied as a multi-finger planar FET. The layout for multi-finger planar FETs consists of interdigitated gate, drain, and source terminals or electrodes. The main amplifier 16 and the peaking amplifier 20 can be formed on the same type or different types of substrates (e.g., semiconductor material wafers), as described in further detail below. The sizes and power handling capabilities of the amplifiers 16 and 20 can vary as compared to each other and the application for use.

In one example, the amplifiers 16 and 20 can be formed as GaN-on-silicon (Si) power transistors. The amplifiers 16 and 20 can also be formed as GaN-on-Silicon Carbide (GaN-on-SiC) transistors or GaN transistors formed on other suitable types of substrates. In other examples, the amplifiers 16 and 20 can be formed from other group III-Nitrides or group III-V direct bandgap active semiconductor devices (e.g., GaAs, InP, InGaP, AlGaAs, etc. devices). The concepts are not limited to group III-V semiconductor devices, however. While the concepts have been described as beneficial for use with power transistors formed from GaN materials, the concepts can also be relied upon with devices formed from other semiconductor materials and processes for other types of circuits, including but not limited to Si LDMOS.

The main amplifier 16 includes a drain contact 40, a gate contact 41, and a source contact. The source contact of the main amplifier 16 is provided on the bottom side of the semiconductor die of the main amplifier 16, and it is not visible in FIG. 2. Similarly, the peaking amplifier 20 includes a drain contact 44, a gate contact 45, and a source contact. The source contact of the peaking amplifier 20 is provided on the bottom side of the semiconductor die of the peaking amplifier 20, and it is not visible in FIG. 2. The bottom-side source contacts of the main amplifier 16 and the peaking amplifier 20 can be electrically connected with the thermal pad 50 using solder, conductive thermal epoxy, or another suitable means. The thermal pad 50 is typically electrically coupled to circuit ground.

The impedance-matching components 12 include the capacitor network 30 and the capacitor network 32. The impedance-matching components 14 include the capacitor network 34 and the capacitor network 36. The capacitor network 30 can be embodied as one or more metal-oxide-semiconductor (MOS) capacitors formed on a substrate. The MOS capacitors are electrically coupled between a bond pad 42, as a first contact on the top side of the substrate, and a second contact on the bottom side of the substrate. The bottom-side contact of the capacitor network 30 is electrically connected with the thermal pad 50. Thus, the capacitor network 30 can be a shunt-connected input capacitor network.

Similar to the capacitor network 30, the capacitor network 32 can be embodied as MOS capacitors formed on a substrate. The MOS capacitors are electrically coupled between a bond pad 43, as a first contact on the top side of the substrate, and a second contact on the bottom side of the substrate. The bottom-side contact of the capacitor network 32 is electrically connected with the thermal pad 50. The capacitor networks 34 and 36 are also similar to the capacitor networks 30 and 32, although all of the capacitor networks 30, 32, 34 and 36 can vary as compared to each other. For example, the capacitor networks 30, 32, 34 and 36 can vary in size, capacitance, internal resistance, Q factor, and other factors as compared to each other.

In the package layout 80, the drain contact 40 of the main amplifier 16 is electrically coupled to the lead frame pad 60 by a number of bond wires. The gate contact 41 of the main amplifier 16 is electrically coupled to the bond pad 42 of the capacitor network 30 by a number of bond wires. The gate contact 41 of the main amplifier 16 is also electrically coupled to the bond pad 43 of the capacitor network 32 by a number of other bond wires. The bond pad 43 of the capacitor network 32 is also electrically coupled to the lead frame pad 61 by a number of bond wires. The number and pitch of the bond wires can vary as compared to that shown, as the bond wires are illustrated as a representative example in FIG. 2.

The drain contact 44 of the peaking amplifier 20 is electrically coupled to the lead frame pad 62 by a number of bond wires. The gate contact 45 of the peaking amplifier 20 is electrically coupled to the bond pad 46 of the capacitor network 34 by a number of bond wires. The gate contact 45 of the peaking amplifier 20 is also electrically coupled to the bond pad 47 of the capacitor network 36 by a number of other bond wires. The bond pad 47 of the capacitor network 36 is also electrically coupled to the lead frame pad 63 by a number of bond wires. The number and pitch of the bond wires can vary as compared to that shown, as the bond wires are illustrated as a representative example in FIG. 2.

Thus, along with other intrinsic parasitic inductances (e.g., from the bond wires) and capacitances, the capacitor networks 30 and 32 provide an input network at the input of the main amplifier 16. The capacitor networks 34 and 36 provide an input network at the input of the peaking amplifier 20. The capacitor networks 30 and 34 can be relied upon in particular for second-harmonic termination and control for the main amplifier 16 and the peaking amplifier 20, respectively. As examples, the amplifier 10 can be designed for operation at carrier frequencies between about 2 GHz and 6 GHz, such as 2.5 GHz, 3 GHZ, or 4 GHz, but the amplifier 10 can be used at other frequencies and frequency ranges. Depending upon the operating frequency, second harmonics might be in the range of 4-9 GHz or higher. Improved second-harmonic termination at the inputs of the amplifiers 16 and 20 can increase the peak drain efficiency of the amplifiers 16 and 20 and potentially increase the peak output power of the amplifiers 16 and 20, among other benefits.

However, the MOS capacitor networks 30 and 34 have certain limitations for second-harmonic termination of the main amplifier 16 and the peaking amplifier 20. For example, it is difficult to improve the internal resistance and the Q factor of MOS capacitors beyond a certain extent using current processing technologies. The capacitor networks 30 and 34 can also limit the ability for phase alignment adjustments and related improvements. These factors limit the ability to improve second-harmonic control for the main amplifier 16 and the peaking amplifier 20. To address the limitations of the capacitor networks 30 and 34, among other purposes, new types, structures, and arrangements of capacitor networks are described below. The new capacitor networks can be relied upon for improved second-harmonic control in the amplifier 10 and for other purposes. The new capacitor networks are not shown in FIG. 2, but an example of the new capacitor networks is described below with reference to FIG. 6.

Figure 3A:
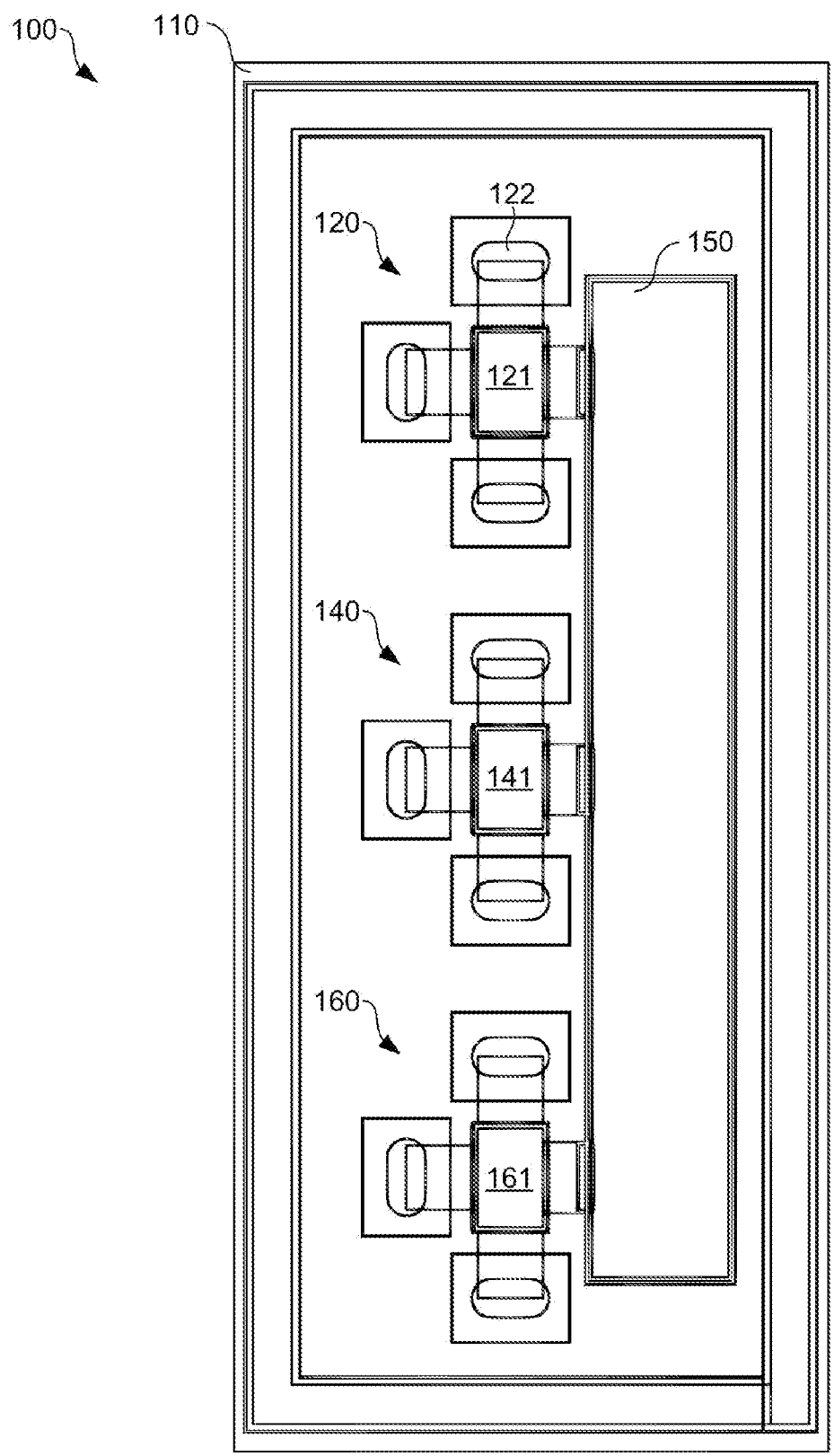
FIGS. 3A and 3B illustrate example capacitor networks according various embodiments described herein.

FIG. 3A illustrates a capacitor network 100 of MIM capacitors according various embodiments described herein. As one example, the capacitor network 100, and variations and extensions thereof, can be used in place of one or more of the capacitor networks 30, 32, 34, and 36 in the package layout 80 in FIG. 2 and the amplifier 10 in FIG. 1, but the capacitor network 100 can be used in other designs. The capacitor network 100 is provided as one example, and a number of different variations of the capacitor network 100 are described in further detail below.

As shown in FIG. 3A, the capacitor network 100 is formed on a substrate 110. The capacitor network 100 includes capacitor arrangements 120, 140, and 160. The capacitor arrangements 120, 140, and 160 can be formed using a semiconductor manufacturing process for relatively high voltage (e.g., 20 V or higher) operations and robustness against physical elements (e.g., heat & humidity), although any suitable semiconductor manufacturing processes can be relied upon.

The capacitor arrangement 120 includes a MIM capacitor 121. Similarly, the capacitor arrangement 140 includes a MIM capacitor 141, and the capacitor arrangement 160 includes a MIM capacitor 161. A top conductive plate or metal layer of the MIM capacitor 121 is electrically coupled to the bond pad 150 on the top side of the substrate 110 using a first metal layer. A bottom conductive plate or metal layer of the MIM capacitor 121 is electrically coupled to a contact on the bottom side of the substrate 110 by a through-substrate via 122, among others. The MIM capacitor 121 also includes an insulating layer, such as a layer of suitable dielectric material, between the top and bottom conductive plates. The capacitor arrangements 140 and 160 are similar to the capacitor arrangement 120.

Each of the MIM capacitors 121, 141, and 161 can be designed for a particular amount of capacitance. As examples, each of the MIM capacitors 121, 141, and 161 can be designed to have a capacitance of between about 0.4 pF and 1.2 pF, for a total capacitance of the capacitor network 100 between about 1.2 pF and 3.6 pF when the MIM capacitors 121, 141, and 161 are coupled together in parallel. However, other capacitances are within the scope of the embodiments, and the MIM capacitors 121, 141, and 161 can be designed to relatively precise capacitances in the range of about 0.1 pF and 2.0 pF, to any tenth of a picofarad (or less). The MIM capacitors 121, 141, and 161 can be designed at larger capacitances, however, beyond 2.0 pF, 3.0 pF, 4.0 pF or more. The capacitances of each of the MIM capacitors 121, 141, and 161 can be controlled or determined by design, based on the sizes of the conductive plates. Additionally, one or more of the MIM capacitors 121, 141, and 161 can be omitted from the capacitor network 100. Other variations are described below.

The capacitor network 100 with MIM capacitors 121, 141, and 161 offers a number of benefits as compared to MOS capacitor networks. For example, the dimensions of the MIM capacitors 121, 141, and 161 can be individually tailored for better precision in overall capacitance. The arrangements of the through-substrate vias around each of the MIM capacitors 121, 141, and 161 results in lower overall intrinsic resistances. The Q factor of each of the MIM capacitors 121, 141, and 161 is based on a ratio of the energy stored in the capacitor to the energy dissipated by thermal losses in an equivalent series resistance in the capacitor. Thus, with improved intrinsic resistances of the MIM capacitors 121, 141, and 161, the Q factor of the capacitor network 100 is improved as compared to MOS capacitor networks. Additionally, the bond pad 150 provides a relatively large area for wire bonding, and the spacing of wire bonds along the bond pad 150 can facilitate phase alignment using the capacitor network 100. The spacing of the MIM capacitors 121, 141, and 161 along the bond pad 150 can also facilitate phase alignment using the capacitor network 100. These and other improvements make the capacitor network 100 better suited for second-harmonic termination as part of an input network at the inputs of power transistors and amplifiers. These improvements can also make the capacitor network 100 better suited for first-harmonic termination. Additional details on and variations of the capacitor network 100 are described below.

Figure 4A:
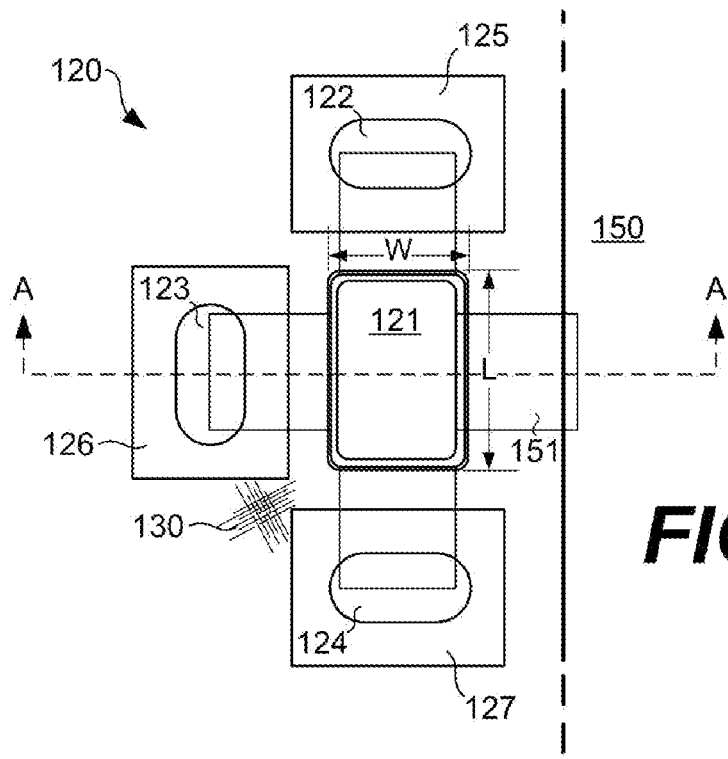
FIG. 4A illustrates an example capacitor arrangement used in the capacitor networks shown in FIGS. 3A and 3B according various embodiments described herein.
Figure 4B:
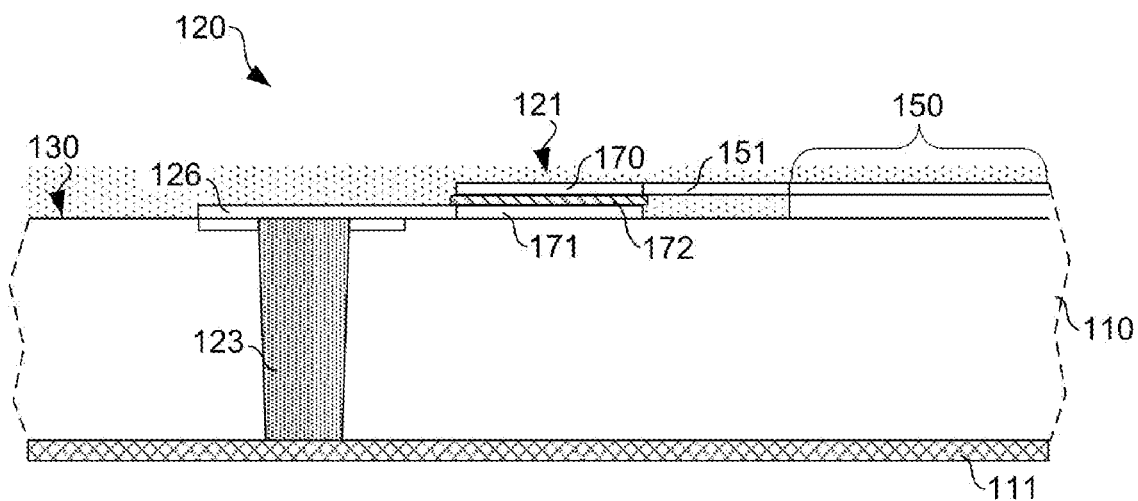
FIG. 4B illustrates the cross-sectional view A-A identified in FIG. 4A according various embodiments described herein.

FIG. 4A illustrates the capacitor arrangement 120 in greater detail, and FIG. 4B illustrates the cross-sectional view A-A identified in FIG. 4A. FIGS. 4A and 4B are not necessarily drawn to scale, and the relative dimensions of certain layers and components can vary in practice and among the embodiments. Also, the capacitor arrangement 120 can include other layers and features that are omitted from view in FIGS. 4A and 4B, for simplicity, as the illustrations are provided as an example to describe the concepts.

Referring between FIGS. 4A and 4B, the capacitor arrangement 120 includes the MIM capacitor 121 formed on the top surface 130 of the substrate 110. The MIM capacitor 121 includes a first metal layer 170, a second metal layer 171, and an insulator layer 172 between the first metal layer 170 and the second metal layer 171. The first metal layer 170 and the second metal layer 171 are the conductive plates of the MIM capacitor 121. The metal layers 170 and 171 can be formed from any suitable metal or metals depending on the integrated semiconductor processing technology being used. As examples, aluminum, copper, gold, nickel, other metals, or combinations thereof can be used for the metal layers 170 and 171. If needed, adhesion layers of titanium or chrome, for example, can be deposited before depositing aluminum, copper, gold, nickel, or other metals. The metal layers 170 and 171 can also be formed using any suitable processing techniques and steps. The insulator layer 172 can be embodied as any suitable dielectric material(s), such as an oxide, a silicon oxide (SiO), silicon nitride (SiN), or other material.

The size of the MIM capacitor 121 can vary by design to achieve a certain capacitance. For example, either or both of the length "L" and the width "W" of the MIM capacitor 121 can vary as compared to that shown in FIG. 4A. The MIM capacitor 121 can also vary in shape as compared to the rectangular shape shown. The thickness of the insulator layer 172 can also vary, as another way to alter the capacitance of the MIM capacitor 121.

The second, bottom metal layer 171 of the MIM capacitor 121 is electrically coupled to the through-substrate vias 122-124 by the metal pads 125-127, which extend to the bottom metal layer 171. Although physically separated from each other, the metal pads 125-127 can be formed from the same metal material during a single processing step. In some cases, the second metal layer 171 can also be formed from the same metal material and processing step as the metal pads 125-127. In other cases, the metal pads 125-127 and the second metal layer 171 can be formed in different processing steps and using different metals as each other. In any case, the metal pads 125-127 and second metal layer 171 are electrically coupled together.

The first, top metal layer 170 of the MIM capacitor 121 is electrically coupled to the bond pad 150 by the metal trace 151. The top metal layer 170 and the metal trace 151 can be formed from the same metal material and during the same processing step. In other cases, the top metal layer 170 and the metal trace 151 can be formed in different processing steps and using different metals. The bond pad 150 can be formed from two metal layers, for additional thickness. For example, layers of the bond pad 150 can be formed when the metal layers 170 and 171 of the MIM capacitor 121 are formed. In other cases, the bond pad 150 can be formed by one metal processing step. The shapes, dimensions, and relative positions of the metal pads 125-127, the first metal layer 170, the second metal layer 171, and the bond pad 150 can also vary as compared to that shown in FIGS. 4A and 4B.

Referring to FIG. 4B, the first metal layer 170 of the MIM capacitor 121 is electrically coupled to the bond pad 150 by the metal trace 151. The second metal layer 171 is electrically coupled by the through-substrate via 123 to a ground plane 111 formed on a bottom side of the substrate 110. The ground plane 111 can be electrically coupled to the thermal pad 50 in the package layout 80 (see FIG. 2), for example. Thus, the MIM capacitor 121 can be relied upon as a shunt-connected capacitor in an input network, as one example, although other connections are within the scope of the embodiments.

Although not shown in FIG. 4B, the through-substrate vias 122 and 124 also couple the second metal layer 171 of the MIM capacitor 121 through the substrate 110 to the ground plane 111. The number of through-substrate vias can vary among the embodiments. For example, additional vias can be implemented around the MIM capacitor 121 beyond the vias 122-124. Alternatively, or one or more of the vias 122-124 can be omitted. The vias 122 and 124 can be omitted, for example, and the capacitor arrangement 120 can include only the via 123. In another case, the via 123 can be omitted, and the capacitor arrangement 120 can include the vias 122 and 124. Other variations are within the scope of the embodiments. The number of through-substrate vias can alter the equivalent series resistance and Q factor of the MIM capacitors described herein. Thus, in some cases it may be preferable to use at least two or three through-substrate vias to increase the Q factor of the MIM capacitors.

Figure 3B:
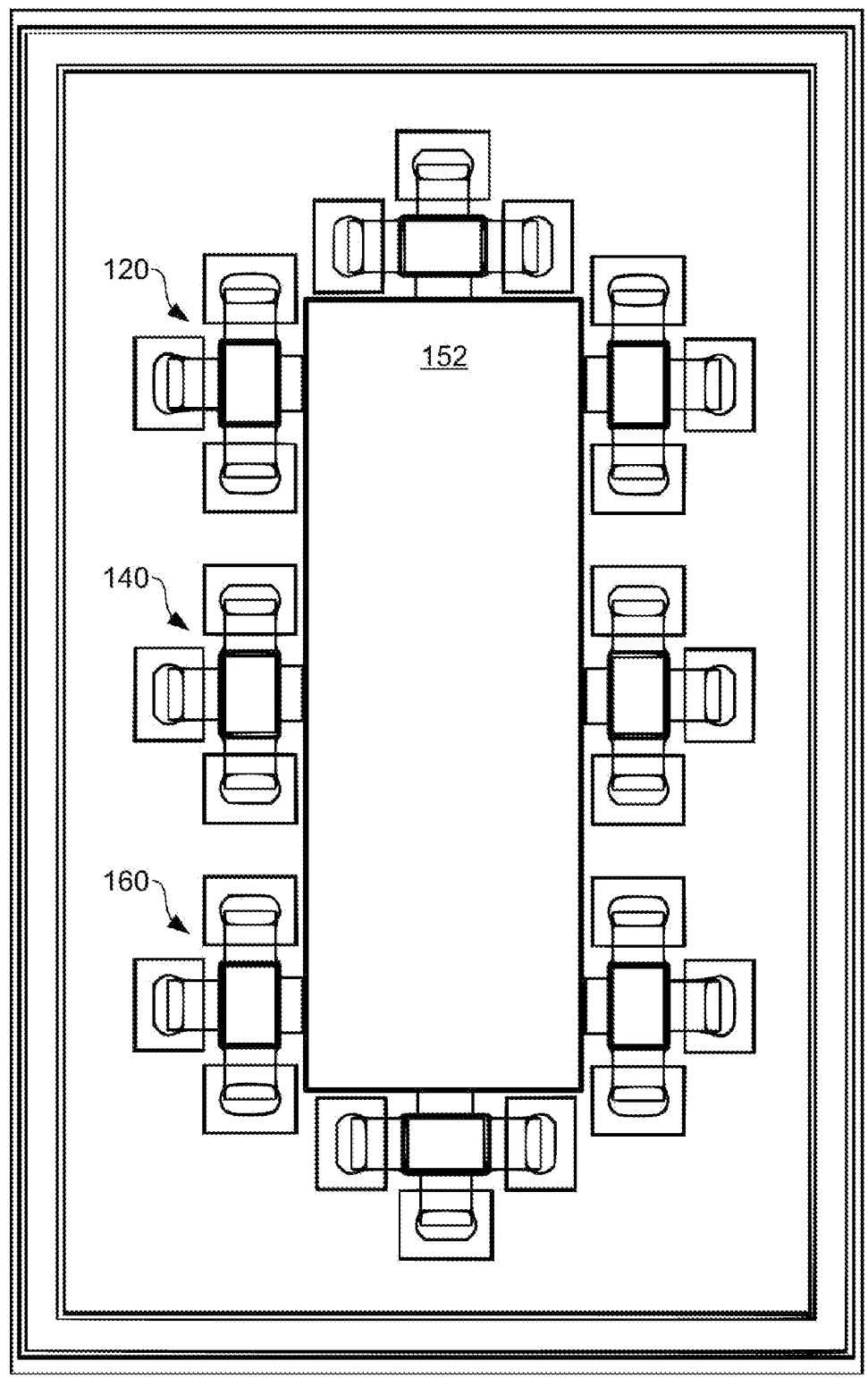

Referring back to FIG. 3A, the capacitor arrangements 140 and 160 can be similar to the capacitor arrangement 120 shown in FIGS. 4A and 4B. In other cases, the capacitor arrangements 120, 140, and 160 can vary as compared to each other. For example, one or more of the MIM capacitors 121, 141, and 161 can vary in size as compared to each other. In another example, the capacitor arrangements 120, 140, and 160 can include different numbers of through-substrate vias. Further, one or more of the capacitor arrangements 120, 140, and 160 can be omitted from the capacitor network 100. The capacitor arrangement 140 can be omitted, for example, leaving the capacitor arrangements 120 and 160, but other combinations are within the scope of the embodiments. Additionally, the dimensions of the bond pad 150 can vary, and the relative positions of the capacitor arrangements 120, 140, and 160 around the bond pad 150 can also vary as compared to that shown. In some cases, capacitor arrangements can be positioned around more than one side or edge of a bond pad, such as in the example shown in FIG. 3B. In FIG. 3B, the capacitor arrangements 120, 140, and 160 are positioned along one side or edge of the bond pad 152, and additional capacitor arrangements are positioned along other sides or edges of the bond pad 152.

Figure 5:
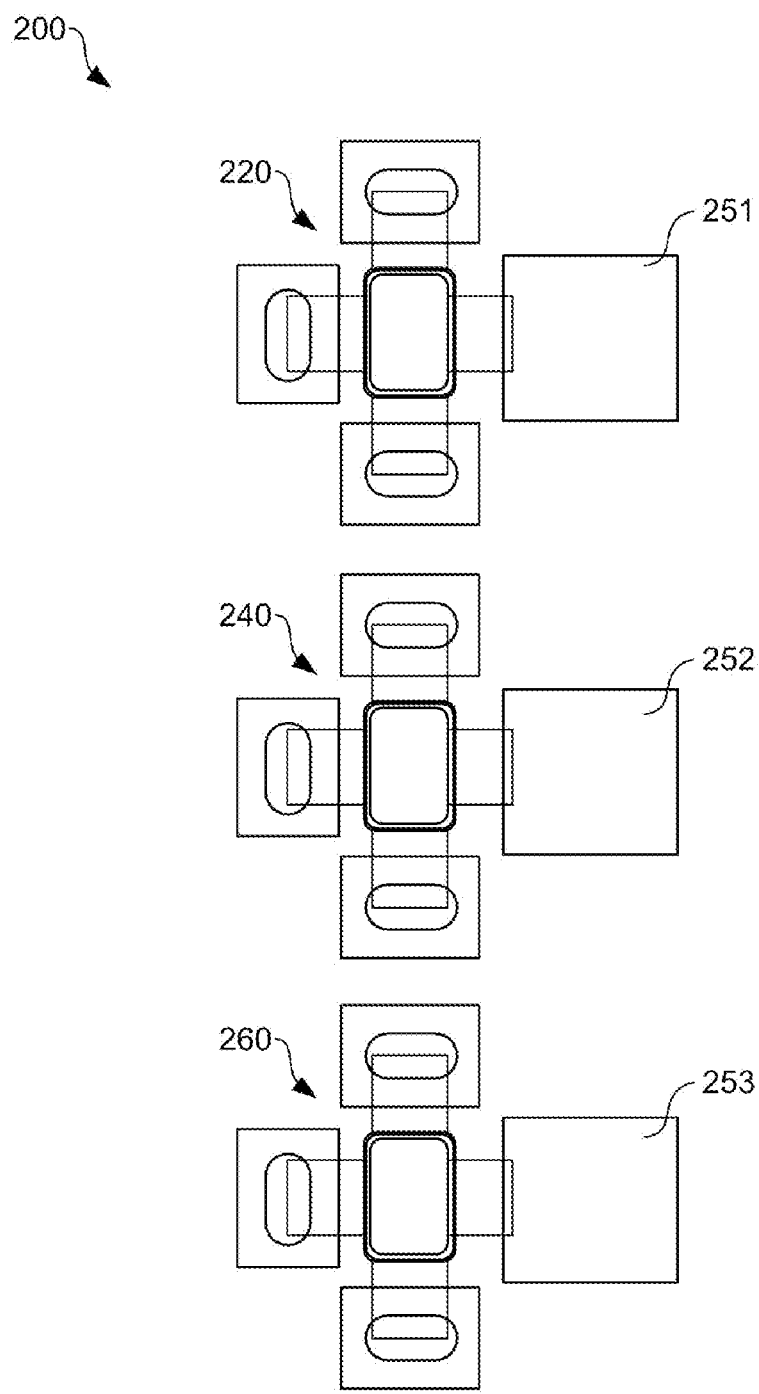
FIG. 5 illustrates another example capacitor network according various embodiments described herein.

FIG. 5 illustrates another example capacitor network 200 according various embodiments described herein. The capacitor network includes capacitor arrangements 220, 240, and 260. The capacitor arrangements 220, 240, and 260 are similar to the capacitor arrangements 120, 140, and 160 shown in FIGS. 3A and 3B, but they are not electrically coupled to a common bond pad. Instead, the capacitor arrangements 220, 240, and 260 include respective bond pads 251, 252, and 253. The bond pads 251, 252, and 253 are electrically isolated from each other. The capacitor network 200 can offer more design flexibility as compared to the capacitor network 100 shown in FIG. 3A. Design rules may limit the number of bond wires that can be attached to the bond pads 251, 252, and 253, so a larger, shared bond pad may be preferable in some cases.

Figure 6:
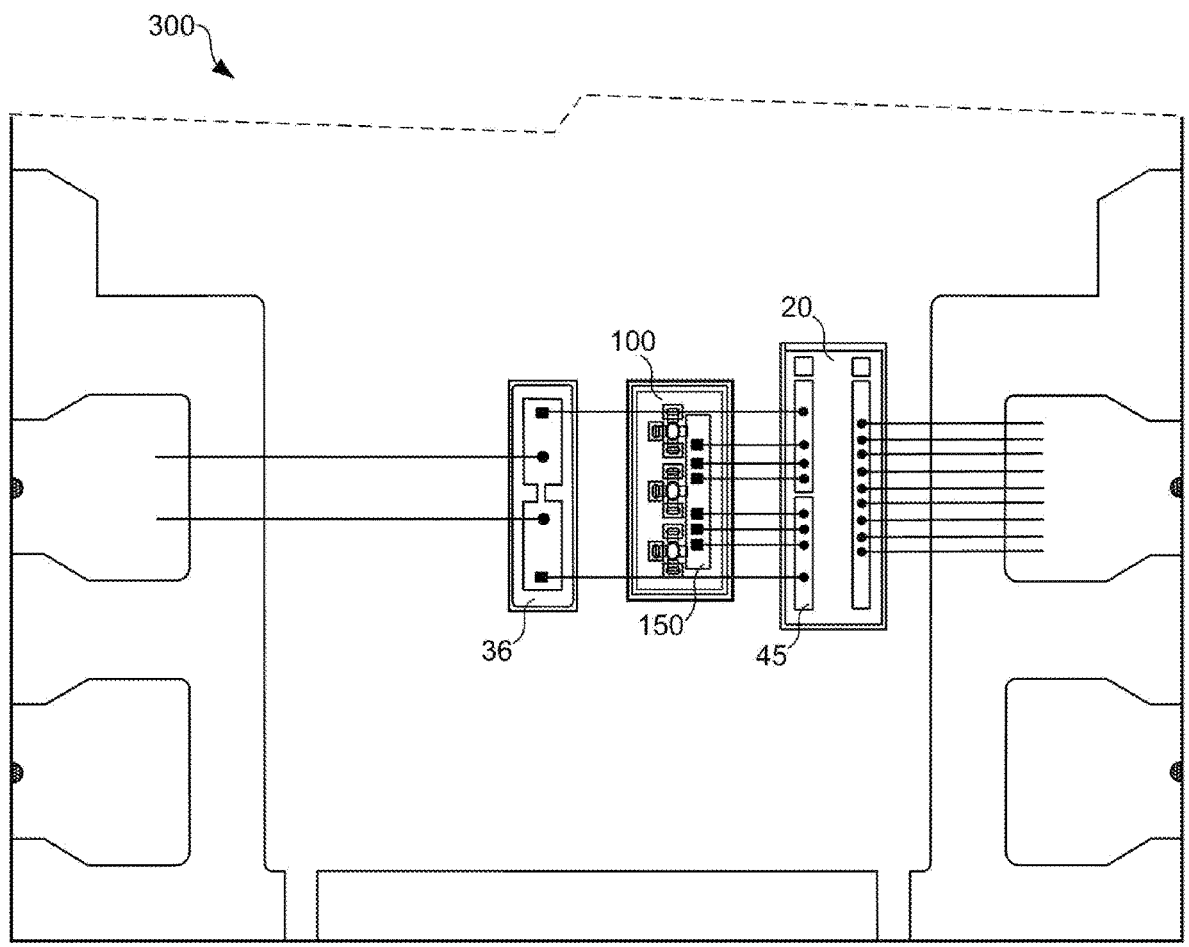
FIG. 6 illustrates an example package layout for an amplifier including a capacitor network according to the concepts described herein.

FIG. 6 illustrates an example package layout 300 according to the concepts described herein. Among other components, the package layout 300 includes the main amplifier 20, the capacitor network 36, and the capacitor network 100. Other components are omitted for simplicity. The package layout 300 is similar to the package layout 80 shown in FIG. 2, but includes the capacitor network 100 (see FIG. 2) in place of the capacitor network 34. The gate contact 45 of the peaking amplifier 20 is electrically coupled to the bond pad 150 of the capacitor network 100 by a number of bond wires. The bond pad 150 is designed to accommodate different numbers and positions of bond wires, because it is relatively long. The number, pitch, and placement of the bond wires can vary as compared to that shown in FIG. 6 in other embodiments.

The capacitor network 100 provides an input network at the input of the peaking amplifier 20. The capacitor network 100 can be relied upon for second-harmonic termination and control of the peaking amplifier 20 in one example. Improved second-harmonic termination at the input of the amplifier 20 can increase the peak drain efficiency and potentially increase the peak output power of the amplifier 20, among other benefits. The capacitor network 34 can be relied upon for first-harmonic or fundamental termination of the peaking amplifier 20. However, depending upon the capacitances of the capacitor networks 34 and 100, respectively, and the bond wires coupling them to the peaking amplifier 20, the capacitor network 34 can be relied upon for second-harmonic termination and the capacitor network 100 can be relied upon for fundamental harmonic termination in other examples.

Although not shown in FIG. 6, other MIM capacitor networks can be used in place of the capacitor network 100. For example, MIM capacitor networks with one, two, three, or more individual MIM capacitors can be used according to the embodiments described herein, with the same or different capacitances, and with the same or different numbers of through-substrate vias. MIM capacitor networks with one, two, three, or more individual bond pads can also be used according to the embodiments described herein. In some cases, a MIM capacitor network according to the concepts can also be used in place of the capacitor network 36. Similarly, MIM capacitor networks according to the concepts can be used in place of one or both of the capacitor network 30 and 32 of the main amplifier 16.

The embodiments can be used with group III-V direct bandgap active semiconductor transistor devices, such as the III-Nitrides (Aluminum (Al)—, Gallium (Ga)—, Indium (In)—, and their alloys (AlGaIn) based Nitrides), Gallium Arsenide (GaAs), Indium Phosphide (InP), Indium Gallium Phosphide (InGaP), Aluminum Gallium Arsenide (AlGaAs), etc. devices, including high-electron mobility transistors (HEMTs), pseudomorphic high-electron mobility transistors (pHEMTs), and metamorphic high-electron mobility transistors (mHEMTs). The concepts are not limited to group III-V semiconductor devices, however. While the concepts have been described as beneficial for use with power transistors formed from GaN materials, the concepts can also be relied upon with devices formed from other semiconductor materials and processes for other types of circuits, including but not limited to Si LDMOS.

While some of the embodiments described herein are described with respect to GaN-on-Si transistors, it is understood that the embodiments described herein can also be applied to GaN-on-SiC transistors, as well as other types of transistors. In any case, the techniques and optimizations described herein offer a number of cost and size improvements, among other possible device characteristic improvements. As used herein, the phrase "gallium nitride material" or GaN semiconductor material refers to gallium nitride and any of its alloys, such as aluminum gallium nitride ($Al_x Ga_{(1-x)} N$), indium gallium nitride ($In_y Ga_{(1-y)} N$), aluminum indium gallium nitride ($Al_x In_y Ga_{(1-x-y)} N$), gallium arsenide phosphide nitride ($GaAs_a P_b N_{(1-a-b)}$), aluminum indium gallium arsenide phosphide nitride ($Al_x In_y Ga_{(1-x-y)} As_a P_b N_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" may be used to describe the relative relationship of certain components, these terms are used for convenience only, for example, as a direction in examples shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A capacitor network formed on a substrate, comprising:
a bond pad over a top side of the substrate; and
a plurality of metal-insulator-metal (MIM) capacitors positioned over the top side of the substrate and along a plurality of different sides of the bond pad, wherein:
a first metal layer of each of the plurality of MIM capacitors is electrically coupled to the bond pad by a first metal trace that extends across and over the top side of the substrate between the first metal layer of the MIM capacitor and the bond pad; and
a second metal layer of each of the plurality of MIM capacitors is electrically coupled to a ground plane on a bottom side of the substrate by a second metal trace that extends across and over the top side of the substrate between the second metal layer of the MIM capacitor and a through-substate via.

2. The capacitor network according to claim 1, further comprising a plurality of through-substate vias positioned along a number of different sides of a MIM capacitor among the plurality of MIM capacitors.

3. The capacitor network according to claim 1, wherein each MIM capacitor among the plurality of MIM capacitors is electrically coupled to the ground plane by a plurality of through-substate vias.

4. The capacitor network according to claim 1, wherein the plurality of MIM capacitors are positioned along four different sides of the bond pad.

5. The capacitor network according to claim 1, wherein:
the capacitor network comprises a plurality of bond pads; and
the plurality of MIM capacitors are electrically coupled to the plurality of bond pads.

6. An integrated device, comprising:
a power transistor formed on a first substrate;
a capacitor network formed on a second substrate, the capacitor network comprising:
a bond pad over a top side of the second substrate; and
a plurality of metal-insulator-metal (MIM) capacitors positioned over the top side of the second substrate and along a plurality of different sides of the bond pad, wherein:
a first metal layer of each of the plurality of MIM capacitors is electrically coupled to the bond pad by a first metal trace that extends across and over the top side of the second substrate between the first metal layer of the MIM capacitor and the bond pad; and
a second metal layer of each of the plurality of MIM capacitors is electrically coupled to a ground plane on a bottom side of the second substrate by a second metal trace that extends across and over the top side of the second substrate between the second metal layer of the MIM capacitor and a through-substate via; and
at least one bond wire electrically coupled between the power transistor and the bond pad of the capacitor network.

7. The integrated device according to claim 6, further comprising a plurality of through-substate vias positioned along a number of different sides of a MIM capacitor among the plurality of MIM capacitors.

8. The integrated device according to claim 6, wherein each MIM capacitor among the plurality of MIM capacitors is electrically coupled to the ground plane by a plurality of through-substate vias.

9. The integrated device according to claim 6, wherein the plurality of MIM capacitors are positioned along four different sides of the bond pad.

10. The integrated device according to claim 6, wherein:
the capacitor network comprises a plurality of bond pads; and
the plurality of MIM capacitors are electrically coupled to the plurality of bond pads.

11. The integrated device according to claim 6, wherein the first substrate and the second substrate are arranged together in a single device package of the integrated device.

12. The integrated device according to claim 6, further comprising:
a second capacitor network formed on a third substrate; and
at least one bond wire electrically coupled between the power transistor and the second capacitor network, wherein the first substrate, the second substrate, and the third substrate are arranged together in a single device package of the integrated device.

13. A capacitor network, comprising
a bond pad over a substrate; and
a plurality of metal-insulator-metal (MIM) capacitors positioned over the substrate and along a plurality of different sides of the bond pad, wherein:
a first metal layer of each of the plurality of MIM capacitors is electrically coupled to the bond pad by a first metal trace that extends across and over the substrate between the first metal layer of the MIM capacitor and the bond pad; and
a second metal layer of each of the plurality of MIM capacitors is electrically coupled to a ground plane by a second metal trace that extends across and over the substrate between the second metal layer of the MIM capacitor and a through-substate via.

14. The capacitor network according to claim 13, wherein each MIM capacitor among the plurality of MIM capacitors is electrically coupled to the ground plane by a plurality of through-substrate vias.

15. The capacitor network according to claim 1, wherein each MIM capacitor among the plurality of MIM capacitors has a same capacitance.

16. The capacitor network according to claim 1, wherein each MIM capacitor among the plurality of MIM capacitors has a different capacitance.

17. The integrated device according to claim 6, wherein each MIM capacitor among the plurality of MIM capacitors has a same capacitance.

18. The integrated device according to claim 6, wherein each MIM capacitor among the plurality of MIM capacitors has a different capacitance.

19. The capacitor network according to claim 13, wherein each MIM capacitor among the plurality of MIM capacitors has a same capacitance.

20. The capacitor network according to claim 13, wherein each MIM capacitor among the plurality of MIM capacitors has a different capacitance.

\* \* \* \* \*